(12) United States Patent
Choi et al.

(10) Patent No.: US 8,026,511 B2
(45) Date of Patent: Sep. 27, 2011

(54) ORGANIC LIGHT EMITTING DISPLAY DEVICE AND METHOD OF FABRICATING THE SAME

(75) Inventors: Dong-Soo Choi, Suwon-si (KR); Jin-Woo Park, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 1119 days.

(21) Appl. No.: 11/529,912

(22) Filed: Sep. 29, 2006

(65) Prior Publication Data
US 2007/0170455 A1 Jul. 26, 2007

(30) Foreign Application Priority Data
Jan. 25, 2006 (KR) .................. 10-2006-0007964

(51) Int. Cl.
*H01L 35/24* (2006.01)
*H01L 51/00* (2006.01)
(52) U.S. Cl. ............... 257/40; 257/59; 257/72; 313/512
(58) Field of Classification Search .................... 257/40, 257/59, 72; 313/512
See application file for complete search history.

(56) References Cited

U.S. PATENT DOCUMENTS

| | | | |
|---|---|---|---|
| 4,238,704 A | 12/1980 | Bonk et al. | |
| 6,555,025 B1 | 4/2003 | Krupetsky et al. | |
| 6,605,893 B2 * | 8/2003 | Ando | 313/495 |
| 6,833,668 B1 * | 12/2004 | Yamada et al. | 313/505 |
| 6,998,776 B2 * | 2/2006 | Aitken et al. | 313/512 |
| 7,063,902 B2 * | 6/2006 | Kikuchi et al. | 428/690 |
| 2003/0066311 A1 * | 4/2003 | Li et al. | 65/43 |
| 2003/0222061 A1 * | 12/2003 | Langer et al. | 219/121.66 |
| 2004/0069017 A1 * | 4/2004 | Li et al. | 65/43 |
| 2004/0206953 A1 * | 10/2004 | Morena et al. | 257/40 |

(Continued)

FOREIGN PATENT DOCUMENTS
CN 1577413 A 2/2005
(Continued)

OTHER PUBLICATIONS

Office Action Issued on Oct. 10, 2008 in Corresponding Chinese Patent Application No. 200710004069.1 With Its English Translation—11 Pages.

(Continued)

*Primary Examiner* — Eugene Lee
*Assistant Examiner* — Anthony Ho
(74) *Attorney, Agent, or Firm* — Knobbe Martens Olson & Bear LLP

(57) ABSTRACT

An organic light emitting device according to one embodiment of the present invention comprises a first substrate defining a pixel region and a non-pixel region; an array of organic light emitting pixels formed in the pixel region of the first substrate; a second substrate placed over the first substrate, the array being interposed between the first and second substrates; a frit seal interposed between and interconnecting the first and second substrates, wherein the frit seal comprises a plurality of elongated segments, which in combination surrounds the array; and at least one conductive line formed in the non-pixel region and elongated substantially parallel to one of the plurality of elongated segments of the frit seal, wherein no conductive line in the non-pixel region is elongated substantially parallel to one of the elongated segments and overlaps the elongated segment substantially parallel thereto when viewed from the first or second substrate.

22 Claims, 9 Drawing Sheets

U.S. PATENT DOCUMENTS

| | | |
|---|---|---|
| 2005/0001545 A1* | 1/2005 | Aitken et al. ............... 313/512 |
| 2005/0174039 A1 | 8/2005 | Nishikawa et al. |
| 2005/0233885 A1 | 10/2005 | Yoshida et al. |
| 2005/0248270 A1* | 11/2005 | Ghosh et al. ............... 313/512 |
| 2005/0275342 A1* | 12/2005 | Yanagawa ................. 313/504 |
| 2005/0277355 A1* | 12/2005 | Choi et al. ..................... 445/25 |
| 2006/0087230 A1* | 4/2006 | Ghosh et al. ............... 313/512 |
| 2007/0013292 A1* | 1/2007 | Inoue et al. ................. 313/504 |
| 2007/0024171 A1* | 2/2007 | Kawaguchi et al. ........ 313/292 |
| 2008/0048556 A1* | 2/2008 | Logunov et al. ............ 313/504 |

FOREIGN PATENT DOCUMENTS

| | | |
|---|---|---|
| JP | 09-278483 | 10/1997 |
| JP | 10-074583 | 3/1998 |
| JP | 2005 158672 | 6/2005 |
| JP | 2005-216746 | 8/2005 |
| JP | 2005 258395 | 9/2005 |
| JP | 2005-258405 | 9/2005 |
| JP | 2005-352504 | 12/2005 |
| JP | 2006 524419 | 11/2006 |
| KR | 10-2005-0076664 | 7/2005 |

OTHER PUBLICATIONS

Japanese Office Action issued on Sep. 8, 2009 in the corresponding Japanese Patent Application 2007-014350.

* cited by examiner

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2006-0007964, filed Jan. 25, 2006, the disclosure of which is incorporated herein by reference in its entirety.

BACKGROUND

1. Field

The invention relates to an organic light emitting display, and more particularly, to packaging of an organic light emitting display.

2. Description of the Related Technology

With the goal of improving upon the shortcomings of certain displays such as cathode ray tubes, attention has recently been focused on flat panel displays such as a liquid crystal display, an organic light emitting display, a plasma display panel (PDP), and so on.

Since the liquid crystal display is a passive device rather than an emissive device, it is difficult to make it have high brightness and contrast, a wide viewing angle, and a large-sized screen. While the PDP is an emissive device, it is heavy, consumes much power, and requires a complex manufacturing process, compared to other displays.

Meanwhile, since the organic light emitting display (OLED) is an emissive device, it has a wide viewing angle, and high contrast. In addition, since it does not require a backlight, it can be made lightweight, compact, and power efficient. Further, the OLED can be driven at a low DC voltage, has a rapid response speed, and is formed entirely of solid material. As a result, the OLED has the ability to withstand external impact and a wide range of temperatures, and can be fabricated by a simple method at low cost. The above discussion is simply to describe the general field of organic light emitting displays and is not a discussion of the prior art.

SUMMARY OF CERTAIN INVENTIVE ASPECTS

Embodiments provide an organic light emitting display and a method of fabricating the same that are capable of inhibiting an element from being damaged due to a large amount of heat generated when the laser irradiates a glass frit for sealing a substrate.

One embodiment includes an organic light emitting device comprising a first substrate defining a pixel region and a non-pixel region, an array of organic light emitting pixels formed in the pixel region of the first substrate, a second substrate placed over the first substrate, the array being interposed between the first and second substrates, a frit seal interposed between and interconnecting the first and second substrates, wherein the frit seal comprises a plurality of elongated segments, which in combination surrounds the array, and at least one conductive line formed in the non-pixel region and elongated substantially parallel to one of the plurality of elongated segments of the frit seal wherein no conductive line is formed in the non-pixel region and elongated substantially parallel to one of the elongated segments to overlap the elongated segment substantially parallel thereto when viewed from the first or second substrate.

A further embodiment includes a method of making an organic light emitting display, the method comprising providing a device comprising a first substrate defining a pixel region and a non-pixel region, the device further comprising an array of organic light emitting pixels formed in the pixel region of the first substrate, the device further comprising conductive lines formed in the non-pixel region, providing a second substrate over the first substrate, the array being interposed between the first and second substrates, interposing a frit between the first and second substrates so as to interconnect the first and second substrates, the frit comprising a plurality of elongated segments, and wherein the plurality of elongated segments are arranged so as to surround the array in combination, wherein the plurality of elongated segments is further arranged such that no conductive line in the non-pixel region is elongated substantially parallel to one of the elongated segments and to overlap the elongated segment substantially parallel thereto when viewed from the first or second substrate.

A further embodiment includes an organic light emitting display comprising a substrate, organic light emitting devices arranged in an array, at least a first conductive line extending in a first direction, an encapsulating substrate arranged opposite the substrate with the array of light emitting devices and at least first conductive line interposed therebetween, and a glass frit arranged between the substrate and encapsulating substrate to in combination form an encapsulation for the array, the glass frit comprising a plurality of segments, at least one segment extending substantially in the first direction, the at least one segment extending substantially in the first direction being spaced laterally apart from the at least first conductive line.

BRIEF DESCRIPTION OF THE DRAWINGS

The above and other features of the invention will be described in reference to certain exemplary embodiments thereof with reference to the attached drawings in which.

DETAILED DESCRIPTION OF EMBODIMENTS

Figure 1:
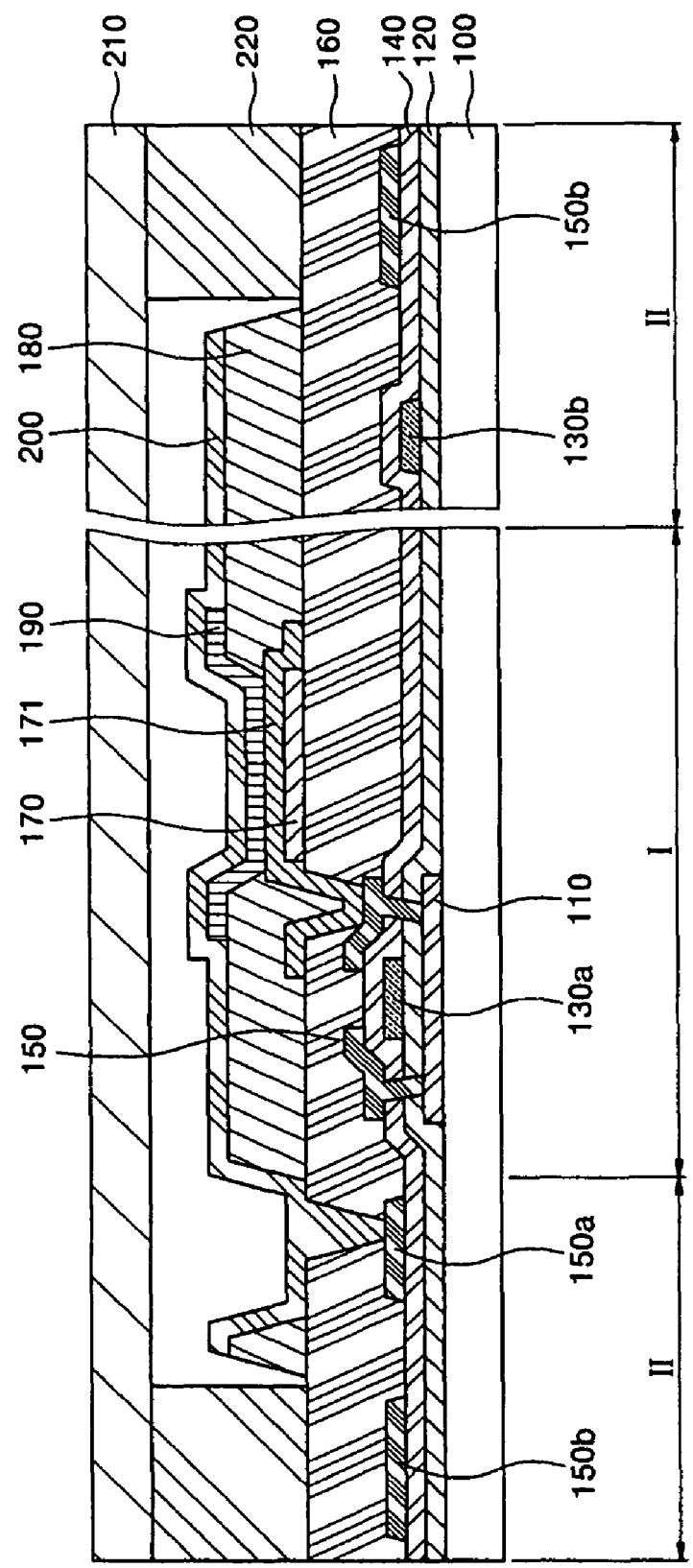
FIG. 1 is a cross-sectional view of a typical organic light emitting display.

Various embodiments of the invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the illustrated dimensions of layers and regions may be exaggerated for clarity and should not be interpreted as being to scale. Like reference numerals designate like elements throughout the specification.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6:
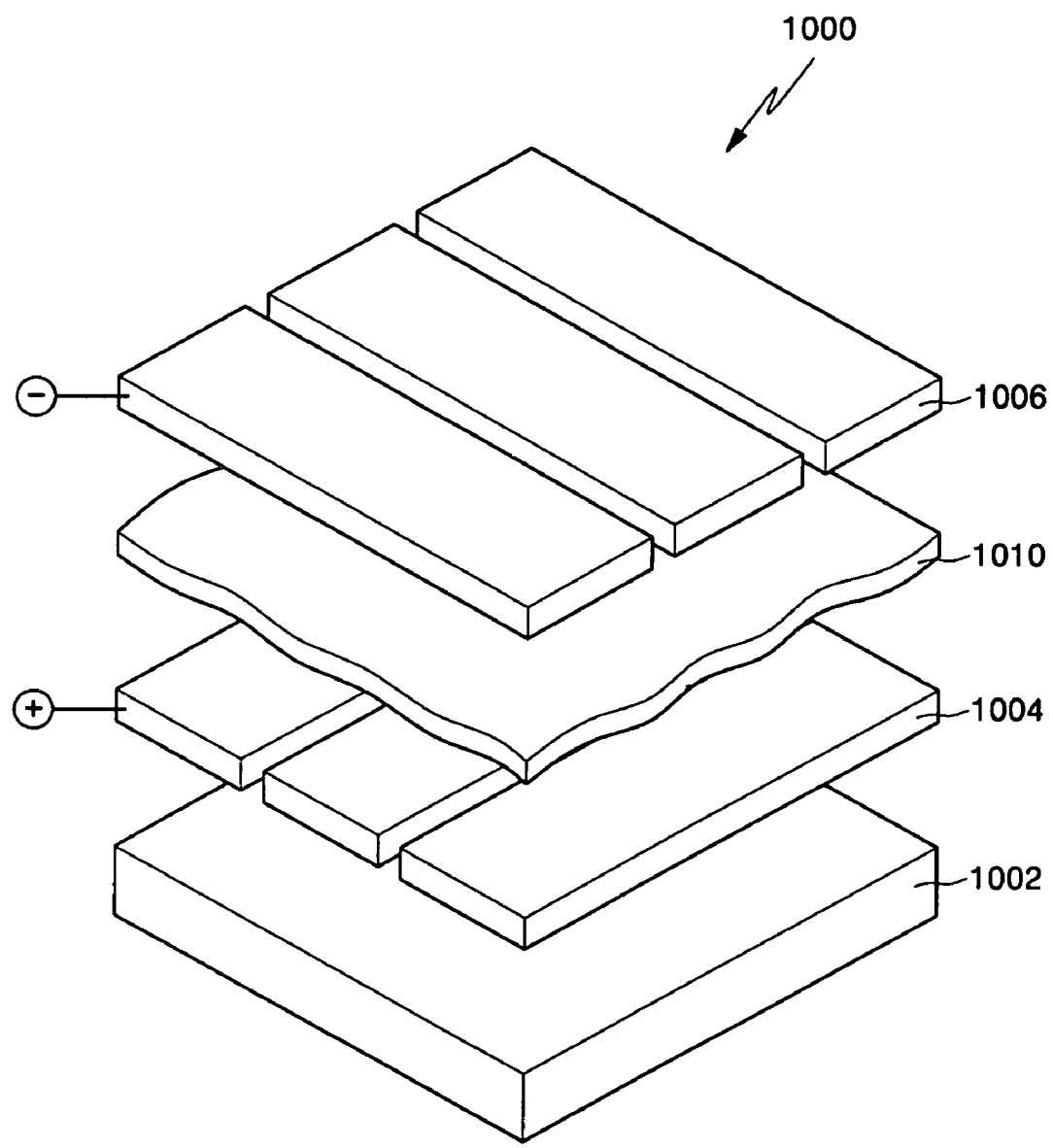
FIG. 6 is a schematic exploded view of a passive matrix type an organic light emitting display device in accordance with one embodiment.
Figure 7:
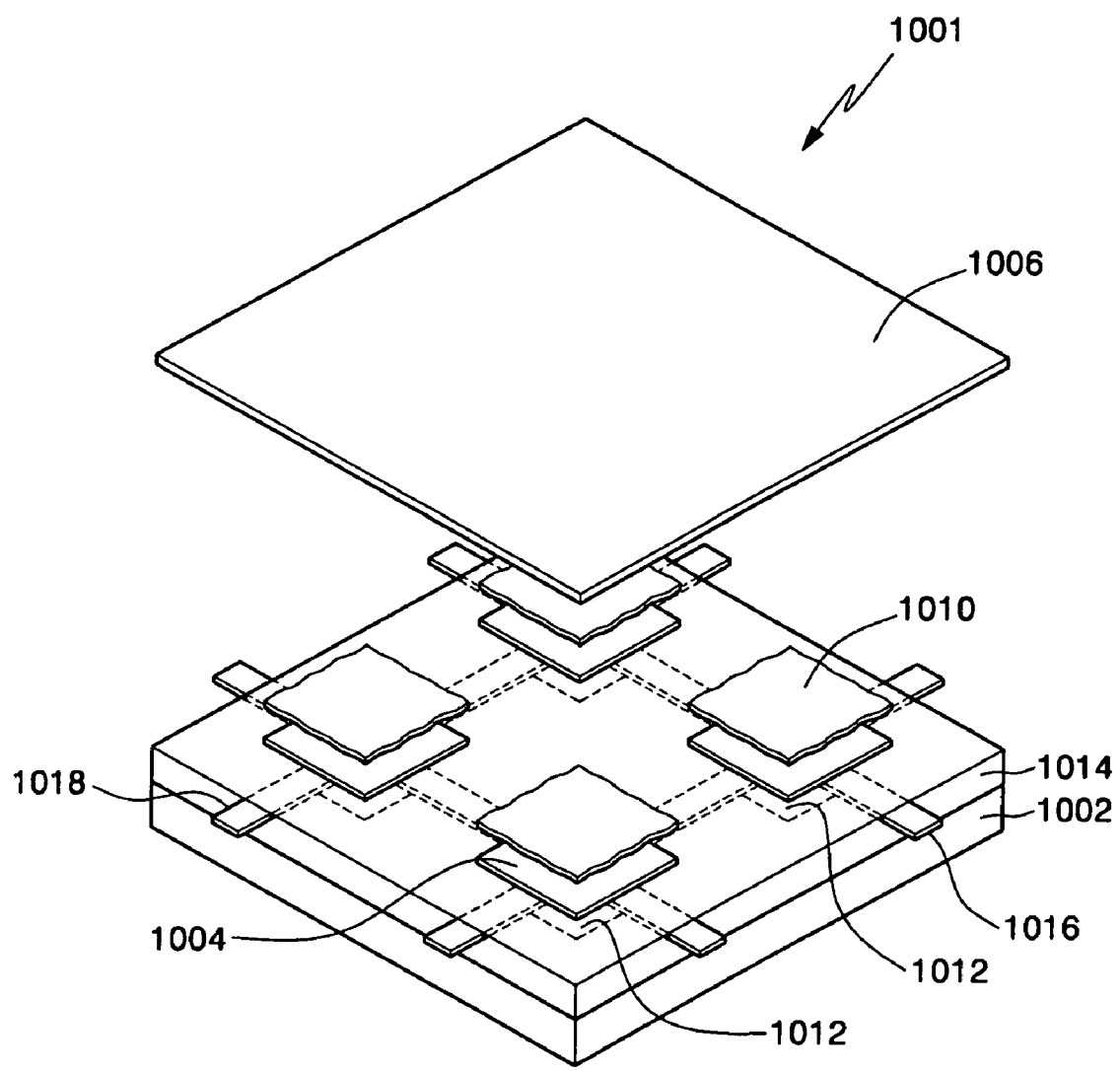
FIG. 7 is a schematic exploded view of an active matrix type organic light emitting display device in accordance with one embodiment.

OLEDs can be generally grouped into two basic types dependent on the arrangement with which the stimulating electrical current is provided. FIG. 6 schematically illustrates an exploded view of a simplified structure of a passive matrix type OLED 1000. FIG. 7 schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 8:
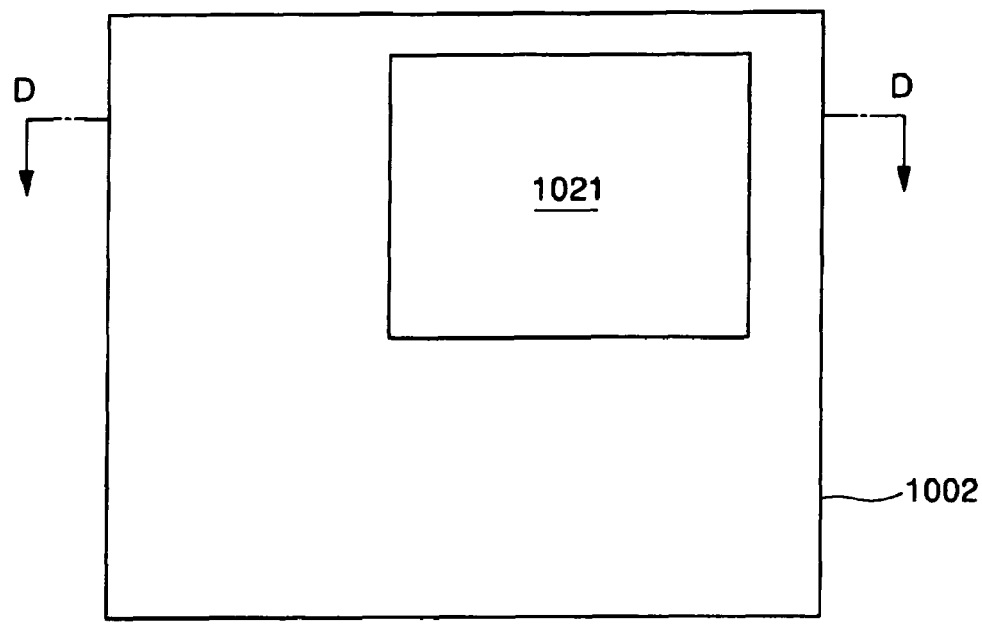
FIG. 8 is a schematic top plan view of an organic light emitting display in accordance with one embodiment.

In many embodiments, an OLED pixel array 1021 comprising a plurality of organic light emitting pixels is arranged over a substrate 1002 as shown in FIG. 8. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 9:
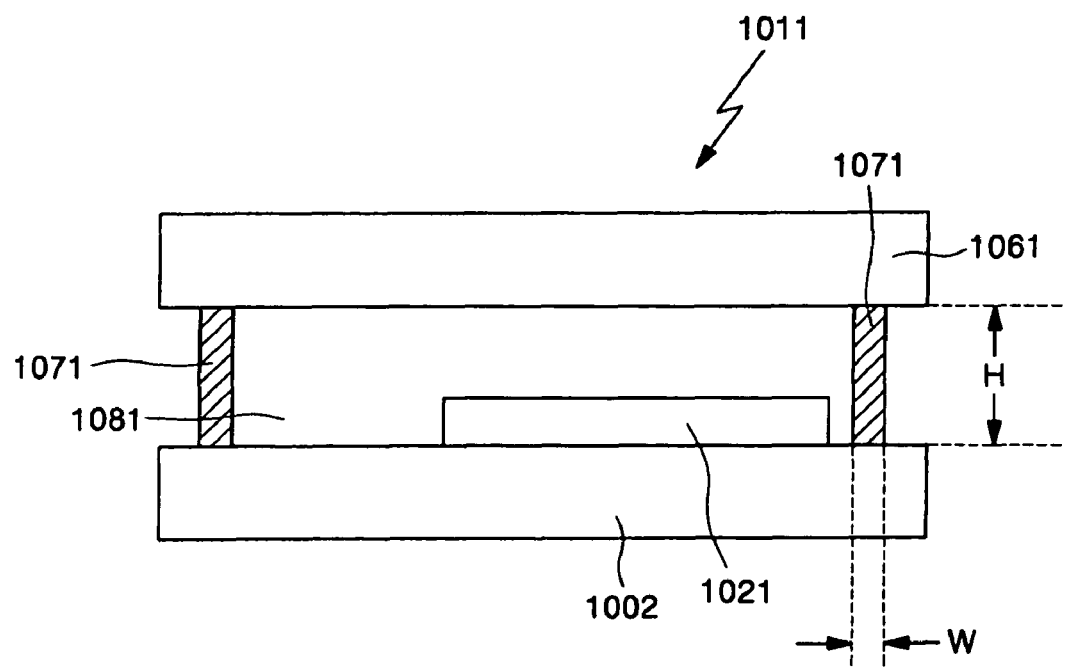
FIG. 9 is a cross-sectional view of the organic light emitting display of FIG. 8A, taken along the line 9-9.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 9 schematically illustrates a cross-section of an encapsulated OLED device 1011 having a layout of FIG. 8 and taken along the line 9-9 of FIG. 8. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 9. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 9. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or "glass frit,"

which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 10:
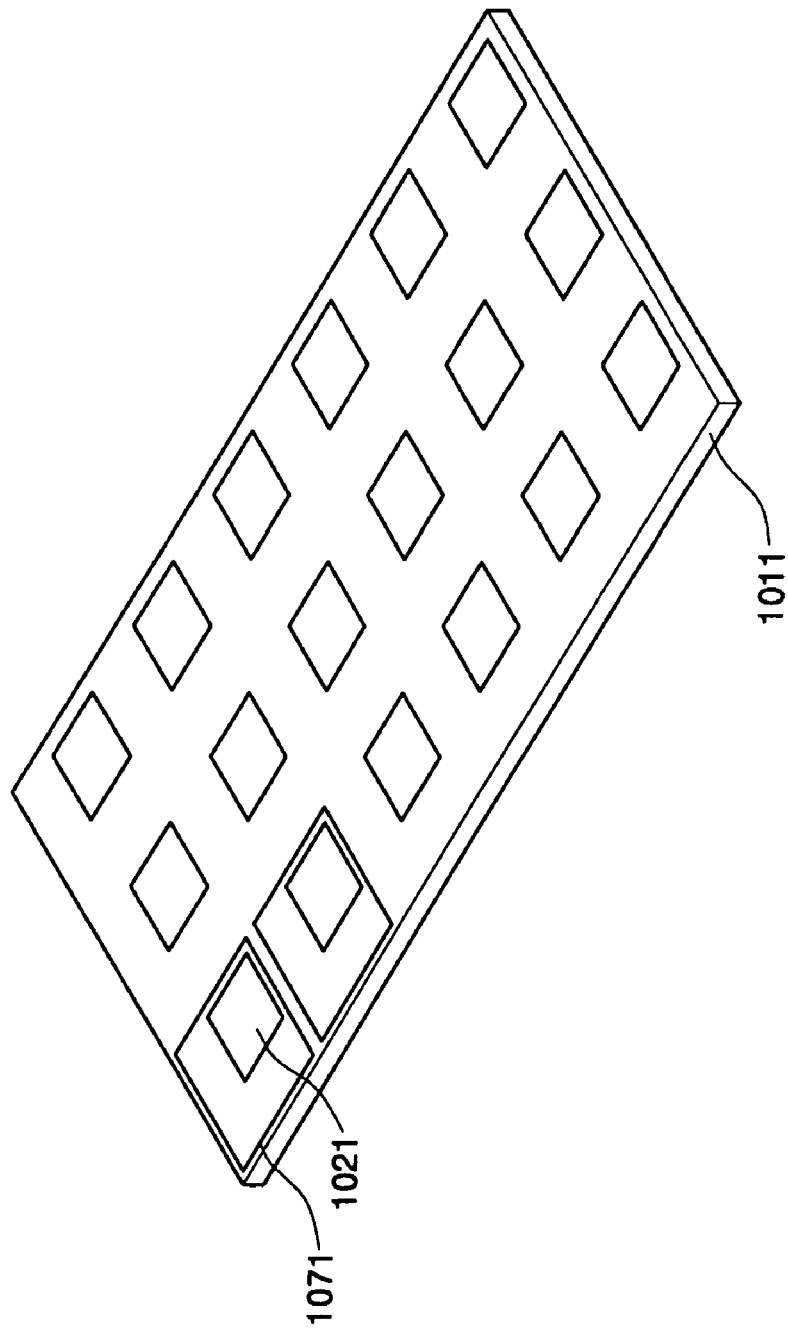
FIG. 10 is a schematic perspective view illustrating mass production of organic light emitting devices in accordance with one embodiment.

In some embodiments, OLED devices 1011 are mass produced. In an embodiment illustrated in FIG. 10, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 9. In certain embodiments, the individual OLED devices 1011 then further undergo additional packaging operations to further improve the sealing formed by the frit seal 1071 and the top and bottom substrates 1061, 1002.

FIG. 1 is a cross-sectional view of one embodiment of an organic light emitting display. Referring to FIG. 1, the organic light emitting display includes a semiconductor layer 110, a gate insulating layer 120, a gate electrode 130a, a scan driver 130b, an interlayer insulating layer 140, and source and drain electrodes 150, which are disposed on a substrate 100 having a pixel region I and a non-pixel region II. In addition, the organic light emitting display further includes a common power supply line 150b, and a second electrode power supply line 150a, which are formed of source and drain interconnections.

A planarization layer 160 is disposed on the surface of the substrate 100. The planarization layer 160 is formed of an organic material such as acryl-based resin or polyimide-based resin. A first electrode 171 including a reflective layer 170 is disposed on the substrate 100, and a pixel defining layer 180 is disposed on the surface of the substrate 100.

An organic layer 190 including at least an emission layer is disposed on the first electrode 171, and a second electrode 200 is disposed thereon. An encapsulating substrate 210 is disposed opposite to the substrate 100, and the substrate 100 and the encapsulating substrate 210 are sealed with a glass frit 220, thereby forming an organic light emitting display.

However, this embodiment of organic light emitting display includes the organic planarization layer disposed under the glass frit for sealing the substrate so that the organic planarization layer is subject to damage due to a large amount of heat generated when a radiant source, such as a laser beam is radiated to the glass frit to form a seal. As a result, adhesive strength at an interface in which the glass frit is adhered to the organic planarization layer may be decreased.

In addition, since a conductive line, i.e., the common power supply line, is disposed under the glass frit, a large amount of heat can be transferred to the conductive line when the glass frit is irradiated with a laser beam, and the heat can be transferred to another conductive line adjacent to the conductive line, thereby possibly causing thermal damage in an element.

Accordingly, as it is preferred that the common power supply line be disposed other than under the glass frit, the element becomes larger, and therefore, it is difficult to make the OLED compact.

Figure 2:
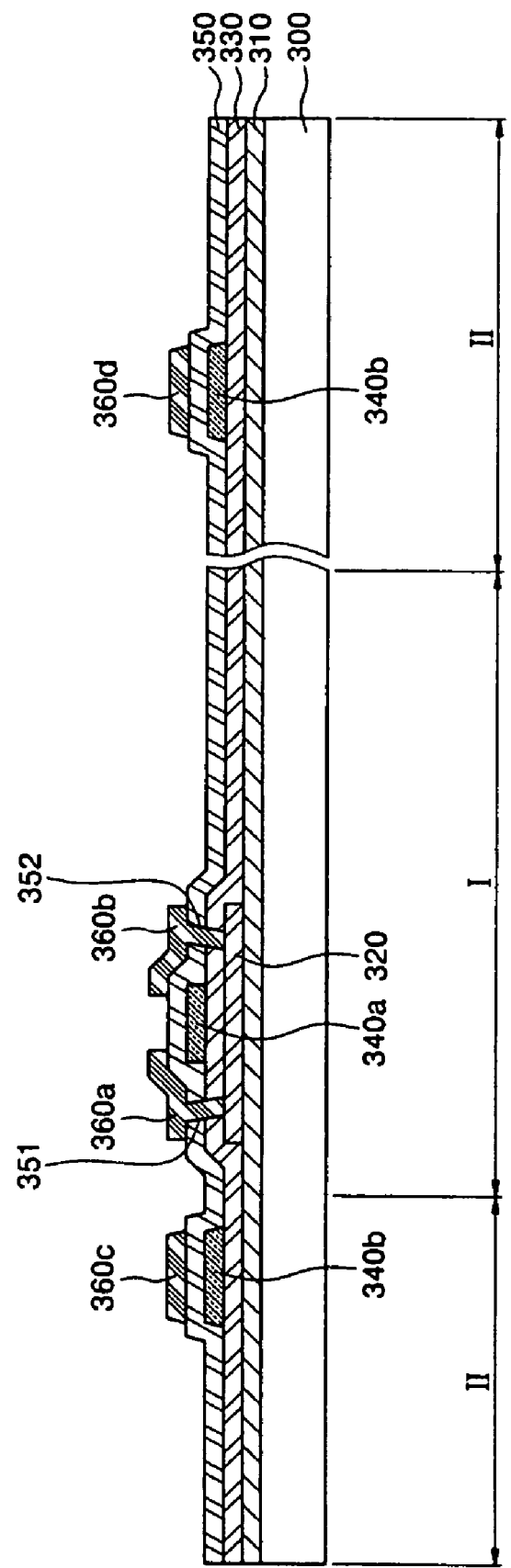
FIGS. 2 to 5 are cross-sectional views of an organic light emitting display in accordance with an exemplary embodiment of the invention.

FIGS. 2 to 5 are cross-sectional views of an organic light emitting display in accordance with an exemplary embodiment of the invention. Referring to FIG. 2, a substrate 300 defining a pixel region I, and a non-pixel region II is provided. The substrate 300 may be an insulating glass substrate, a plastic substrate, or a conductive substrate.

Then, a buffer layer 310 is formed on the surface of the substrate 300. The buffer layer 310 may be a silicon oxide layer, a silicon nitride layer, or a composite layer of the silicon oxide layer and the silicon nitride layer. In addition, the buffer layer 310 functions as a passivation layer for inhibiting impurities from out-diffusing from the substrate 300.

Next, a semiconductor layer 320 is formed on the buffer layer 310 in the pixel region I. The semiconductor layer 320 may be an amorphous silicon layer or a polysilicon layer. Then, a gate insulating layer 330 is formed on the surface of the substrate 300. The gate insulating layer 330 may be a silicon oxide layer, a silicon nitride layer, or a composite layer of the silicon oxide layer and the silicon nitride layer.

Then, a gate electrode 340a is formed on the gate insulating layer 330 corresponding to a portion of the semiconductor layer 320. The gate electrode 340a may be formed of Al, Cu, or Cr.

When the gate electrode 340a is formed, a first conductive line 340b is formed in the non-pixel region II. The first conductive line 340b in certain embodiments acts as a common power supply line (Vdd). In certain embodiments, the first conductive line extends in a generally elongate manner in a first direction, for example out of the page of the FIGS. 2 through 5.

The first conductive line 340b is spaced laterally apart from a region where a glass frit is to be positioned. Generally, the glass frit has a width of about 0.7 mm, which can vary depending on the specifications of a device. There are no requirements/restrictions regarding the distance between the first conductive line 340b and the glass frit as long as the first conductive line 340b does not extend under the glass frit. If the first conductive line 340b is disposed under the glass frit, and the glass frit is irradiated by a laser to seal the substrate, a large amount of heat is transferred to the first conductive line. This heat is then transferred from the first conductive line, which acts as the common power supply line, to a second conductive line, which is spaced apart from the first conductive line and acts as a second electrode power supply line, and then through a second electrode to an element where it can cause damage to an organic layer. Thus, in this embodiment, the first conductive line 340b is spaced laterally apart from the glass frit to inhibit such damage to the organic layer.

Next, an interlayer insulating layer 350 is formed on the surface of the substrate 300. The interlayer insulating layer 350 may be a silicon oxide layer, a silicon nitride layer, or a composite layer of silicon oxide and silicon nitride. The interlayer insulating layer 350 and the gate insulating layer 330 in the pixel region I are etched to form contact holes 351 and 352 for exposing the semiconductor layer 320.

Then, source and drain electrodes 360a and 360b are formed on the interlayer insulating layer 350 in the pixel region I. The source and drain electrodes 360a and 360b may be formed of one or more selected from the group consisting of Mo, Cr, Al, Ti, Au, Pd and Ag. In addition, the source and drain electrodes 360a and 360b are connected to the semiconductor layer 320 through the contact holes 351 and 352.

When the source and drain electrodes 360a and 360b are formed, second and third conductive lines 360c and 360d are simultaneously formed in the non-pixel region II. The second conductive line 360c may act as a second electrode power supply line, and the third conductive line 360d may act as a scan driver.

At this time, the second and third conductive lines 360c and 360d are disposed on the interlayer insulating layer 350 and above the first conductive lines 340b. In addition, the first conductive line 340b may overlap the second conductive line 360c.

Figure 3:
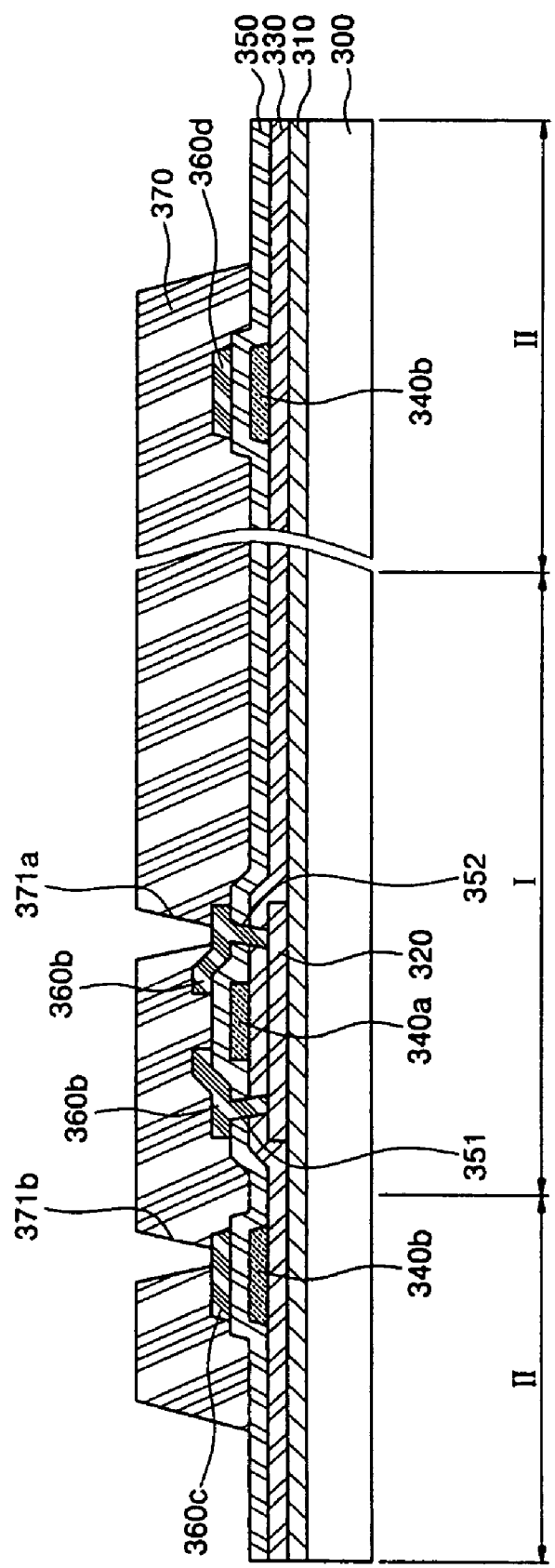

Referring to FIG. 3, a planarization layer 370 is formed on the surface of the substrate 300. The planarization layer 370 may be formed of an organic material such as acryl-based resin, polyimide-based resin, or benzocyclobutene (BCB).

At this time, the planarization layer 370 in the pixel region I is etched to form via-holes 371a and 371b for exposing one of the source and drain electrodes 360a and 360b, and the second conductive line 360c in the non-pixel region II.

In addition, the planarization layer 370, where the glass frit is to be applied, of the non-pixel region II is removed, e.g. by etching. When the substrate is sealed with the glass frit, the glass frit is irradiated, e.g. with a laser beam, to adhere the substrates. At this time, if planarization layer formed of an organic material exists under the glass frit, the planarization layer can be damaged due to a large amount of heat from the laser. As a result, the glass frit may be delaminated from an interface with the planarization layer and thereby decrease adhesive strength thereof.

Therefore, the planarization layer of the edge of the substrate 300 in the non-pixel region II, to which the glass frit is adhered, is removed to inhibit the above problem.

Figure 4:
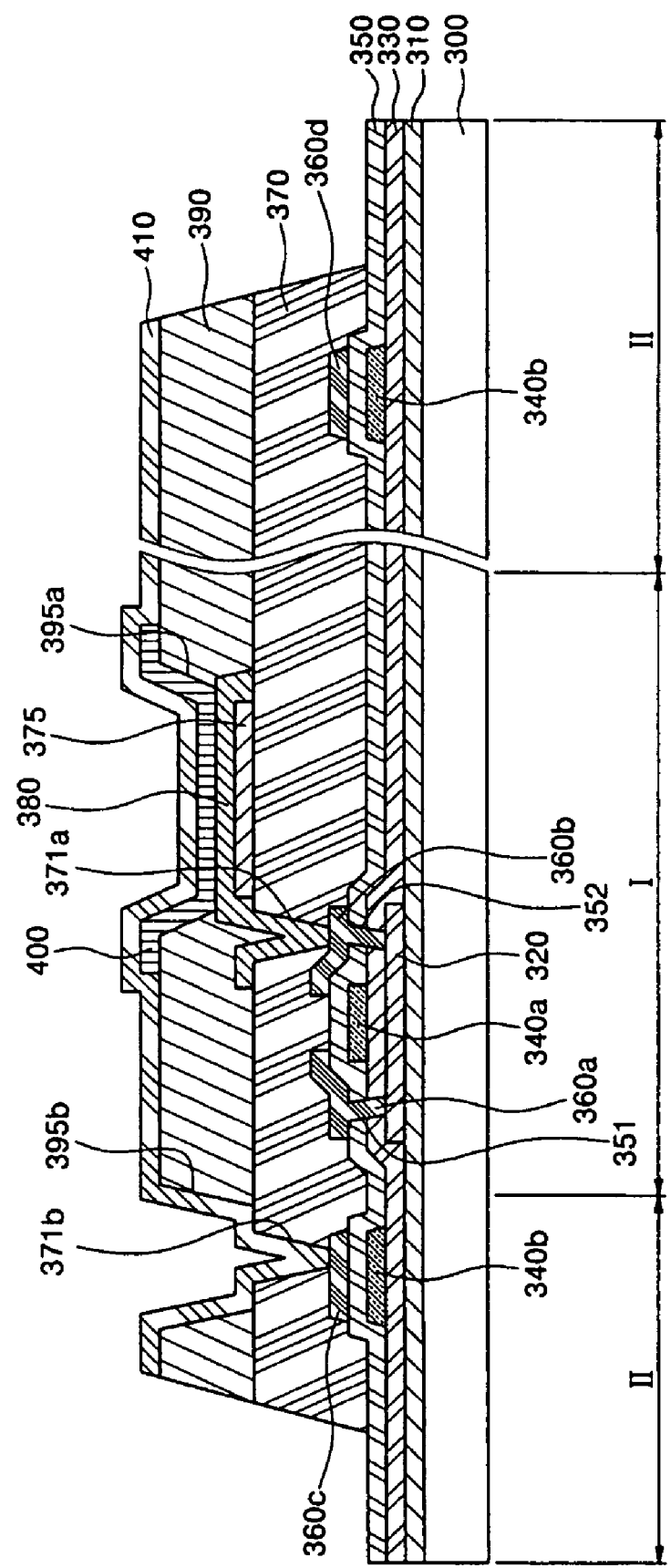

Referring to FIG. 4, a first electrode 380 including a reflective layer 375 is formed on the planarization 370 in the pixel region I. The first electrode 380 is disposed on a bottom surface of the via-hole 371 to be in contact with one of the exposed source and drain electrodes 360a and 360b, and extends onto the planarization layer 370. The first electrode 380 may comprise indium tin oxide (ITO) or indium zinc oxide (IZO).

Then, a pixel defining layer 390 is formed on the surface of the substrate 300 including the first electrode 380 to a thickness sufficient to fill the via-hole 371a, in which the first electrode 380 is disposed. The pixel defining layer 390 may be formed of an organic layer or an inorganic layer, preferably, an organic layer. More preferably, the pixel defining layer 390 is formed of one selected from the group consisting of BCB, acryl-based polymer, and polyimide. The pixel defining layer 390 has high flowability such that the pixel defining layer can be evenly formed on the surface of the substrate.

At this time, the pixel defining layer 390 is etched to form openings 395a and 395b for exposing the first electrode 380 in the pixel region I, and a portion of the second conductive line 360c in the non-pixel region II, respectively. In addition, the pixel defining layer 390, where the glass frit is to be applied, in the non-pixel region II is also removed by etching.

Then, an organic layer 400 is formed on the first electrode 380 exposed through the opening 395a. The organic layer 400 includes at least an emission layer, and may further include at least one of a hole injection layer, a hole transport layer, an electron transport layer, and an electron injection layer.

Next, a second electrode 410 is formed on the surface of the substrate 300. The second electrode 410 is a transmissive electrode, and may be formed of Mg, Ag, Al, Ca, or an alloy thereof. The second electrode 410 is substantially transparent such that light emitted from the organic layer 400 is reflected from the reflective layer 375 and can substantially pass through the second electrode 410. The second electrode 410 also has a low work function.

At this time, the second electrode 410, where the glass frit is to be applied, in the non-pixel region II is removed by etching.

Figure 5:
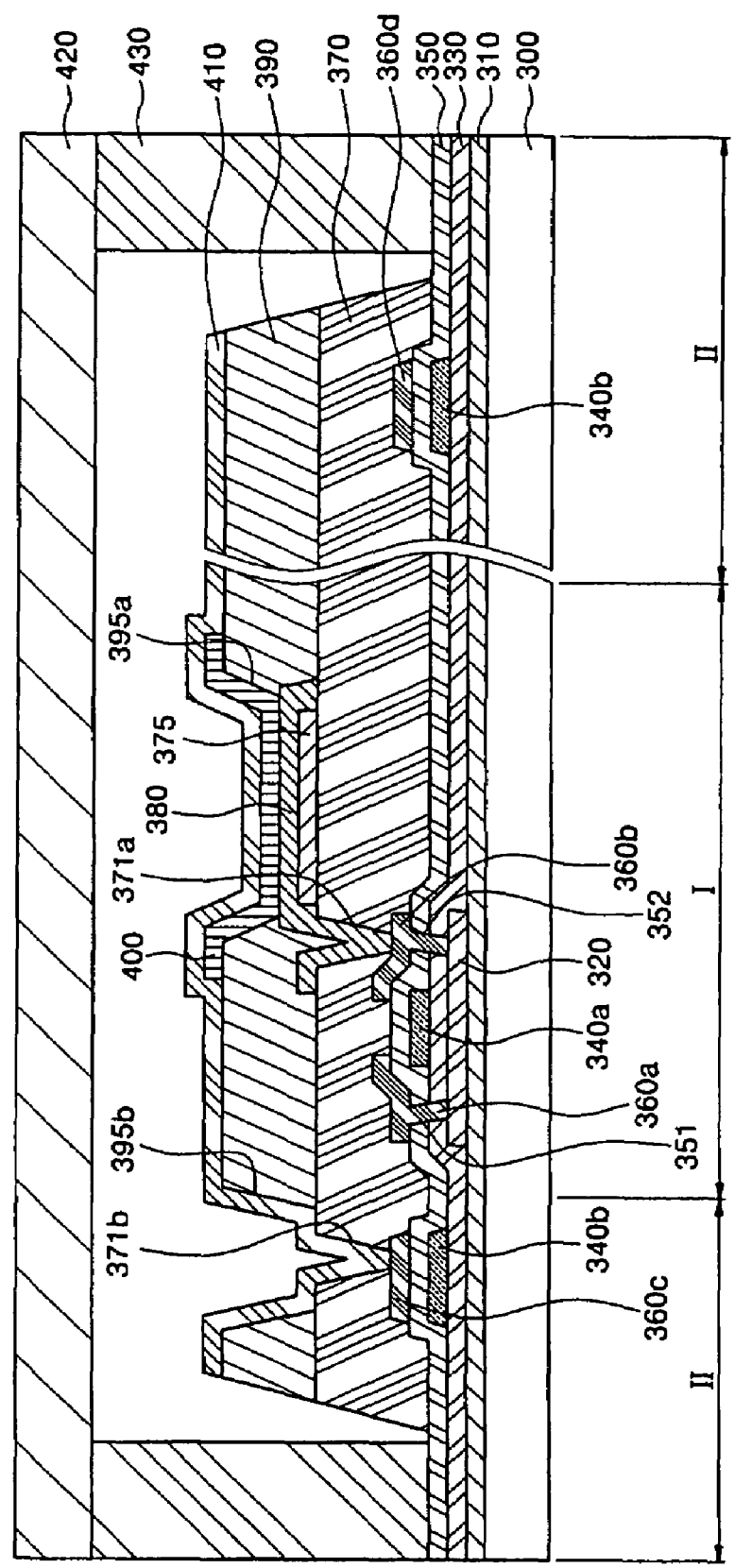

Referring to FIG. 5, an encapsulating substrate 420 opposite to the substrate 300 is provided. The encapsulating substrate 420 may be formed of an etched insulating glass or a non-etched insulating glass. A glass frit 430 is applied to the edge of the encapsulating substrate 420 opposite to the substrate 300. In one embodiment, the glass frit 430 comprising a plurality of interconnected segments which together define the glass frit 430. In certain embodiments, the segments are elongate and at least one of the segments extends generally in the first direction. In one embodiment, at least one of the frit segments is arranged substantially parallel to the first conductive line, but spaced a lateral distance apart therefrom.

The glass frit 430 may be formed of one material selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a composite thereof. The glass frit 430 may be applied by a dispensing method or a screen printing method.

In this embodiment, while the glass frit 430 is applied on the encapsulating substrate 420, the glass frit 430 may be applied on the substrate 300.

Then, after aligning the substrate 300 to the encapsulating substrate 420, they are adhered to each other. At this time, the glass frit 430 is in contact with the interlayer insulating layer 350 as an inorganic layer on the substrate 300 in the non-pixel region II.

Next, the glass frit 430 is irradiated with a laser beam, such that the glass frit 430 is melted and solidified to adhere the substrate and the encapsulating substrate.

As described above, in some embodiments, the organic planarization layer is disposed under the glass frit for sealing the substrate so that the organic planarization layer can be damaged due to a large amount of heat generated when a laser beam is radiated to the glass frit. As a result, adhesive strength at an interface in which the glass frit is adhered to the organic planarization layer may be decreased. However, in this embodiment, the organic planarization layer under the glass frit is removed to inhibit adhesive strength of the glass frit from being lowered.

In addition, since the first conductive line acting as the common power supply line is substantially absent under the glass frit, it is possible to inhibit an element from being thermally damaged due to thermal transfer to the first conductive line and another conductive line adjacent thereto, when the glass frit is irradiated with a laser beam.

As can be seen from the foregoing, in an organic light emitting display and a method of fabricating the same in accordance with the invention, it is possible to inhibit an element from being damaged due to a large amount of heat generated when the laser beam is radiated to a glass frit for sealing a substrate.

Although the invention has been described with reference to certain exemplary embodiments thereof, it will be understood by those skilled in the art that a variety of modifications and variations may be made to the invention without departing from the spirit or scope of the invention defined in the appended claims, and their equivalents.

What is claimed is:

1. An organic light emitting device comprising:
a first substrate defining a pixel region and a non-pixel region;
an array of organic light emitting pixels formed in the pixel region of the first substrate;
a second substrate placed over the first substrate, the array being interposed between the first and second substrates;
a frit seal interposed between and interconnecting the first and second substrates, wherein the frit seal comprises a plurality of elongated segments, which in combination surrounds the array; and
at least one conductive line formed in the non-pixel region and elongated substantially parallel to one of the plurality of elongated segments of the frit seal, wherein no conductive line in the non-pixel region is elongated substantially parallel to one of the elongated segments and overlaps the elongated segment substantially parallel thereto when viewed from the first or second substrate,
wherein the frit seal is formed of glass particles that are heated by light irradiation.

2. The device of claim 1, wherein the at least one conductive line extends substantially throughout the length of the elongated segment to which the at least one conductive line is substantially parallel.

3. The device of claim 1, wherein a first one of the at least one conductive line intersects a first one of the elongated segments while not extending substantially parallel to the first elongated segment.

4. The device of claim 3, wherein one or more layers are interposed between the first conductive line and the first elongated segment where they intersect.

5. The device of claim 1, wherein one of the elongated segments of the frit seal extends along an edge of the first substrate.

6. The device of claim 1, wherein a first one of the at least one conductive line comprises a power line electrically connected to the array.

7. The device of claim 1, further comprising transistors interposed between the first substrate and the array in the pixel region, the transistors comprising a gate electrode, wherein a first one of the at least one conductive line and the gate electrode comprise the same material.

8. The device of claim 7, wherein the transistors further comprise source and drain electrodes, and wherein the source and drain electrodes and the first conductive line comprise the same material.

9. The device of claim 1, further comprising a scan driver arranged in the non-pixel region, wherein the scan driver comprises a first one of the at least one conductive line.

10. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

11. A method of making an organic light emitting display, the method comprising:

provide a device comprising a first substrate defining a pixel region and a non-pixel region, the device further comprising an array of organic light emitting pixels formed in the pixel region of the first substrate, the device further comprising conductive lines formed in the non-pixel region;

providing a second substrate over the first substrate, the array being interposed between the first and second substrates;

interposing a frit between the first and second substrates so as to interconnect the first and second substrates, the fit comprising a plurality of elongated segments; and wherein the plurality of elongated segments are arranged so as to surround the array in combination, wherein at least one conductive line formed in the non-pixel region is elongated substantially parallel to one of the plurality of elongated segments of the frit, wherein the plurality of elongated segments is further arranged such that no conductive line in the non-pixel region is elongated substantially parallel to one of the elongated segments and to overlap the elongated segment substantially parallel thereto when viewed from the first or second substrate, and wherein the frit is formed of glass particles that are heated by light irradiation.

12. The method of claim 11, wherein at least one of the conductive lines in the non-pixel region is substantially parallel to one of the plurality of elongated segments while not overlapping thereto.

13. The method of claim 11, wherein at least one of the conductive lines extends substantially throughout the length of the elongated segment to which the at least one conductive line is substantially parallel.

14. The method of claim 11, wherein one of the conductive lines intersects a first one of the elongated segments while not extending substantially parallel to the first elongated segment.

15. The method of claim 14, wherein one or more layers are interposed between the first conductive line and the first elongated segment where they intersect.

16. The method of claim 11, wherein one of the elongated segments of the fit seal extends along an edge of the first substrate.

17. The method of claim 11, wherein one of the conductive lines comprises a power line electrically connected to the array.

18. The method of claim 11, wherein providing the device comprises providing transistors interposed between the first substrate and the array in the pixel region, the transistors comprising gate electrodes, wherein providing transistors comprises forming one of the conductive lines and the gate electrodes using the same material.

19. The method of claim 18, wherein the transistors further comprise source and drain electrodes, and wherein providing transistors comprises forming the source and drain electrodes and one of the conductive lines using the same material.

20. The method of claim 11, further comprising a scan driver arranged in the non-pixel region, wherein the scan driver comprises one of the conductive lines extending along one of the plurality of segments.

21. The method of claim 11, wherein the device comprises a plurality of additional pixel regions and a plurality of additional non pixel regions, wherein the device further comprises a plurality of additional arrays, wherein the method further comprises interposing a plurality of additional frits between the first and second substrates so as to interconnect the first and second substrates, each additional frit surrounds one of the plurality of additional arrays.

22. The method of claim 21, further comprising cutting the resulting product into pieces, which comprises a single display device comprising a single one of the array.

* * * * *

UNITED STATES PATENT AND TRADEMARK OFFICE
CERTIFICATE OF CORRECTION

PATENT NO. : 8,026,511 B2
APPLICATION NO. : 11/529912
DATED : September 27, 2011
INVENTOR(S) : Choi et al.

It is certified that error appears in the above-identified patent and that said Letters Patent is hereby corrected as shown below:

| Issued Patent | | Description of Discrepancy |
|---|---|---|
| Column | Line | |
| 7 | 54 | Change "cellusolve" to --cellosolve--. |
| 13 | 12 | In Claim 11, change "fit" to --frit--. |
| 14 | 5 | In Claim 16, change "fit" to --frit--. |

Signed and Sealed this
Twenty-fourth Day of April, 2012

David J. Kappos
*Director of the United States Patent and Trademark Office*